United States Patent
Liu et al.

(10) Patent No.: US 10,115,329 B2
(45) Date of Patent: Oct. 30, 2018

(54) DISPLAY SUBSTRATE AND DRIVING METHOD AND DISPLAY DEVICE THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Peng Liu, Beijing (CN); Xue Dong, Beijing (CN); Renwei Guo, Beijing (CN); Kai Yang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 534 days.

(21) Appl. No.: 14/772,091

(22) PCT Filed: Dec. 4, 2014

(86) PCT No.: PCT/CN2014/093062
§ 371 (c)(1),
(2) Date: Sep. 2, 2015

(87) PCT Pub. No.: WO2016/015426
PCT Pub. Date: Feb. 4, 2016

(65) Prior Publication Data
US 2016/0196777 A1    Jul. 7, 2016

(30) Foreign Application Priority Data
Jul. 30, 2014    (CN) .......................... 2014 1 0369714

(51) Int. Cl.
*G09G 3/36* (2006.01)
*G09G 3/20* (2006.01)
(Continued)

(52) U.S. Cl.
CPC ..... *G09G 3/2003* (2013.01); *G02F 1/134309* (2013.01); *G02F 1/134336* (2013.01);
(Continued)

(58) Field of Classification Search
CPC ......... G09G 3/2003; G09G 2340/0457; G09G 2360/16; G09G 2300/0452;
(Continued)

(56) References Cited

U.S. PATENT DOCUMENTS

| 6,172,729 B1 | 1/2001 | Ikeda |
|---|---|---|
| 2008/0117154 A1 | 5/2008 | Yeh |

(Continued)

FOREIGN PATENT DOCUMENTS

| CN | 101303842 A | 11/2008 | |
|---|---|---|---|
| CN | 101393366 * | 3/2009 | ............. G02F 1/133 |

(Continued)

OTHER PUBLICATIONS

May 27, 2016—(CN)—First Office Action Appn 201410369714.X with English Tran.
(Continued)

*Primary Examiner* — Amit Chatly
(74) *Attorney, Agent, or Firm* — Banner & Witcoff, Ltd.

(57) ABSTRACT

A display substrate, a driving method and a display device are described. The display substrate includes pixel groups that are repeatedly arranged. Each pixel group includes two first sub-pixels, two second sub-pixels, and two third sub-pixels. A first sub-pixel, a second sub-pixel, and a third sub-pixel are sequentially arranged in a first pixel row of each pixel group. Another third sub-pixel, another first sub-pixel, and another second sub-pixel are sequentially arranged in a second pixel row of each pixel group. A center line of any sub-pixel of the first pixel row and a center line of any sub-pixel of the second pixel row extend in a column
(Continued)

direction and do not coincide with each other. The display substrate enables the display device to achieve a higher display resolution with a lower physical resolution.

20 Claims, 6 Drawing Sheets

(51) Int. Cl.
  *G02F 1/1343* (2006.01)
  *H01L 27/32* (2006.01)
(52) U.S. Cl.
  CPC ............... *G09G 2300/0452* (2013.01); *G09G 2330/021* (2013.01); *G09G 2340/0457* (2013.01); *G09G 2360/16* (2013.01); *H01L 27/3218* (2013.01)
(58) Field of Classification Search
  CPC ........ G09G 2330/021; G02F 1/134336; G02F 1/134309; H01L 27/3218
  See application file for complete search history.

(56) References Cited

U.S. PATENT DOCUMENTS

2013/0106891 A1\* 5/2013 Matsueda ............ G09G 3/2003
  345/589
2014/0226323 A1\* 8/2014 Huang .................... F21V 21/00
  362/231

FOREIGN PATENT DOCUMENTS

| CN | 101393366 A | 3/2009 |
| CN | 101859028 A | 10/2010 |
| CN | 104166259 A | 11/2014 |
| JP | 11215516 A | 8/1999 |
| WO | 2008093862 A1 | 8/2008 |

OTHER PUBLICATIONS

Apr. 29, 2015—International Search Report and Written Opinion Appn PCT/CN2014/093062 with English Tran.

\* cited by examiner

DISPLAY SUBSTRATE AND DRIVING METHOD AND DISPLAY DEVICE THEREOF

The application is a U.S. National Phase Entry of International Application No. PCT/CN2014/093062 filed on Dec. 4, 2014, designating the United States of America and claiming priority to Chinese Patent Application No. 201410369714.X filed on Jul. 30, 2014. The present application claims priority to and the benefit of the above-identified applications and the above-identified applications are incorporated by reference herein in their entirety.

TECHNICAL FIELD

Embodiments of the present disclosure relate to a display substrate, a driving method for the display substrate, and a display device thereof.

BACKGROUND

A traditional display device implements a display function by using pixels that each include three sub-pixels of a red color, a green color, and a blue color (RGB), respectively. In practical applications, a resolution of the display device may be improved by increasing a number of pixels per inch (Pixels Per Inch, with an abbreviation of PPI) in the display device. To increase the PPI, sizes of the pixels and distances between the pixels may need to be reduced. However, with a continuous refinement of the technology (e.g., the technology that reduces the sizes of the pixels and the distances between the pixels), improvement on the technology may reach its limit.

In the display device, three sub-pixels form a pixel. When the display device requires a large number of pixels to achieve a high display resolution, a large volume of sub-pixels are also needed. Therefore, the following technical problems may be incurred:

1) an actual display resolution of the display device is the same as a physical resolution of the display device. In order to achieve a higher display resolution, the number of sub-pixels may need to be increased to improve the physical resolution of the display device. Since there may be a limit on the improvement of the technology, it may be very difficult to increase the number of sub-pixels after the number of sub-pixels has reached a certain value;

2) a large number of sub-pixels in the display device may result in a large number of data lines in the display device, which may increase a power consumption of the display device and decrease an opening rate of the display device; and 3) a large number of sub-pixels in the display device that each have a small size may incur difficulty in the manufacturing technology of the display device and may increase a cost of the display device.

SUMMARY

According to embodiments of the present disclosure, a display substrate, a driving method for the display substrate and a display device thereof are provided, which enable the display device to achieve a higher display resolution with a lower physical resolution. A power consumption of the display device may be reduced, an opening rate of the display device may be increased, and difficulty in the manufacturing process of the display device and a cost of the display device may be reduced.

According to at least one embodiment of the present disclosure, a display substrate is provided. The display substrate includes pixel groups that are repeatedly arranged. Each of the pixel groups includes two first sub-pixels, two second sub-pixels, and two third sub-pixels. In each of the pixel groups, a first sub-pixel, a second sub-pixel, and a third sub-pixel are sequentially arranged in a first pixel row; another third sub-pixel, another first sub-pixel, and another second sub-pixel are sequentially arranged in a second pixel row; and a center line of any sub-pixel in the first pixel row and a center line of any sub-pixel in the second pixel row extend in a column direction and do not coincide with each other. In a pixel group from the pixel groups, a first sub-pixel and a second sub-pixel in a first pixel row of the pixel group are adjacent to a third sub-pixel in a second pixel row of the pixel group to form a first pixel; a third sub-pixel in the first pixel row of the pixel group and a second sub-pixel in the second pixel row of the pixel group are adjacent to a first sub-pixel in a first pixel row of an adjacent pixel group to form a second pixel; the second sub-pixel in the first pixel row of the pixel group are adjacent to the third sub-pixel and a first sub-pixel in the second pixel row of the pixel group to form a third pixel; and the third sub-pixel in the first pixel row of the pixel group is adjacent to the first sub-pixel and the second sub-pixel in the second pixel row of the pixel group to form a fourth pixel.

For example, a center line of the third sub-pixel in the second pixel row of the pixel group extends in a column direction, and the center line of the third sub-pixel coincides with a boundary line between the first sub-pixel and the second sub-pixel in the first pixel row of the pixel group.

For example, the pixel groups are repeatedly arranged in a row direction and in a column direction. Identical sub-pixels are not adjacent with each other. For two adjacent pixel groups in the column direction, center lines of corresponding sub-pixels in the two adjacent pixel groups extend in the column direction and coincide with each other.

For example, each of the first sub-pixel, the second sub-pixel, and the third sub-pixel has a rectangular shape. Each of the first sub-pixel, the second sub-pixel, and the third sub-pixel has a width-length ratio of 2:3.

For example, each of the first sub-pixels, the second sub-pixels, and the third sub-pixels has a hexagonal shape.

For example, according to a top-to-bottom order in the pixel group, the first pixel row is a pixel row prior to the second pixel row, or the first pixel row is a pixel row after the second pixel row.

According to at least one embodiment of the present disclosure, a display device including any one of the above display substrates is provided.

According to at least one embodiment of the present disclosure, a driving method for driving the display substrate is provided. The driving method may be configured to drive any one of the display substrates described herein. The driving method includes: acquiring an output value of the first sub-pixel, an output value of the second sub-pixel, and an output value of the third sub-pixel in the first pixel row of the pixel group; acquiring an output value of the third sub-pixel, an output value of the first sub-pixel, and an output value of the second sub-pixel in the second pixel row of the pixel group; outputting the output value of the first sub-pixel, the output value of the second sub-pixel, and the output value of the third sub-pixel in the first pixel row of the pixel group; and outputting the output value of the third sub-pixel, the output value of the first sub-pixel, and the output value of the second sub-pixel in the second pixel row of the pixel group.

In some examples, if the pixel group is located at a start edge, the acquiring the output value of the first sub-pixel, the output value of the second sub-pixel, and the output value of the third sub-pixel in the first pixel row of the pixel group includes: setting an input value of the first sub-pixel from the first pixel of the pixel group as the output value of the first sub-pixel in the first pixel row; generating the output value of the second sub-pixel in the first pixel row by dividing a sum of an input value of the second sub-pixel from the first pixel of the pixel group and an input value of the second sub-pixel from the third pixel of the pixel group by two; and generating the output value of the third sub-pixel in the first pixel row by dividing a sum of an input value of the third sub-pixel from the second pixel of the pixel group and an input value of the third sub-pixel from the fourth pixel of the pixel group by two.

For example, if the pixel group is not located at the start edge, the acquiring the output value of the first sub-pixel, the output value of the second sub-pixel, and the output value of the third sub-pixel in the first pixel row of the pixel group includes: generating the output value of the first sub-pixel in the first pixel row by dividing a sum of an input value of the first sub-pixel from the first pixel of the pixel group and an input value of a first sub-pixel from a second pixel of a previous pixel group by two, where the previous pixel group is prior to the pixel group and in the same pixel rows as the pixel group; generating the output value of the second sub-pixel in the first pixel row by dividing a sum of an input value of the second sub-pixel from the first pixel of the pixel group and an input value of the second sub-pixel from the third pixel of the pixel group by two; and generating the output value of the third sub-pixel in the first pixel row by dividing a sum of an input value of the third sub-pixel in the second pixel of the pixel group and an input value of the third sub-pixel from the fourth pixel of the pixel group by two.

For example, the acquiring the output value of the third sub-pixel, the output value of the first sub-pixel, and the output value of the second sub-pixel in the second pixel row of the pixel group includes: generating the output value of the third sub-pixel in the second pixel row by dividing a sum of an input value of the third sub-pixel from the first pixel of the pixel group and an input value of the third sub-pixel from the third pixel of the pixel group by two; generating the output value of the first sub-pixel in the second pixel row by dividing a sum of an input value of the first sub-pixel from the third pixel of the pixel group and an input value of the first sub-pixel from the fourth pixel of the pixel group by two; and generating the output value of the second sub-pixel in the second pixel row by dividing a sum of an input value of the second sub-pixel from the second pixel of the pixel group and an input value of the second sub-pixel from the fourth pixel of the pixel group by two.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the disclosure.

FIG. 2b is a schematic diagram that illustrates a variation of the arrangement of the pixels shown in FIG. 2a;

FIG. 4b is a schematic diagram that illustrates calculation of output values of a first sub-pixel according to the input values of the pixels in FIG. 4a;

FIG. 4c is a schematic diagram that illustrates calculation of output values of a second sub-pixel according to the input values of the pixels in FIG. 4a;

FIG. 4d is a schematic diagram that illustrates output values of a third sub-pixel according to the input values of the pixels in FIG. 4a;

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can acquire all of other embodiments, without any inventive work, which should be within the scope of the disclosure.

Figure 1:
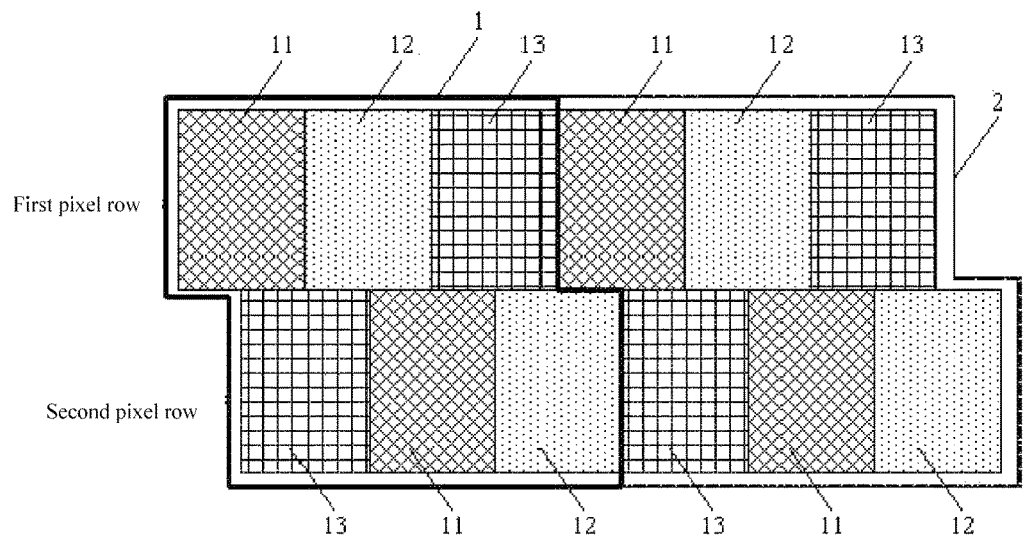
FIG. 1 is a schematic diagram of a configuration of a display substrate according to a first embodiment of the present disclosure.

FIG. 1 is a schematic diagram of a configuration of a display substrate according to a first embodiment of the present disclosure. As shown in FIG. 1, the display substrate includes pixel groups 1 that are repeatedly arranged. Each of the pixel groups 1 includes two first sub-pixels 11, two second sub-pixels 12, and two third sub-pixels 13. A first sub-pixel 11, a second sub-pixel 12, and a third sub-pixel 13 are arranged successively in a first pixel row of the pixel group 1. Another third sub-pixel 13, another first sub-pixel 11, and another second sub-pixel 12 are arranged successively in a second pixel row of the pixel group 1. A center line of any sub-pixel in the first pixel row and a center line of any sub-pixel in the second pixel row extend in a column direction and do not coincide with each other. The first sub-pixel 11 and the second sub-pixel 12 that are in the first pixel row of the pixel group are adjacent to the third sub-pixel 13 in the second pixel row of the pixel group to form a first pixel P1. The third sub-pixel 13 in the first pixel row of the pixel group and the second sub-pixel 12 in the second pixel row of the pixel group are adjacent to the first sub-pixel 11 in the first pixel row of an adjacent pixel group 2 to form a second pixel P2. The second sub-pixel 12 in the first pixel row of the pixel group 1 is adjacent to the third sub-pixel 13 and the first sub-pixel 11 that are in the second pixel row of the pixel group 1 to form a third pixel P3. The third sub-pixel 13 in the first pixel row of the pixel group 1 is adjacent to the first sub-pixel 11 and the second sub-pixel 12 that are in the second pixel row of the pixel group 1 to form a fourth pixel P4.

It is understood that, in embodiments described herein, adjacency of the sub-pixels includes not only adjacency of the sub-pixels in a row direction, but also adjacency of the sub-pixels in a column direction. The adjacency of the sub-pixels may include an adjacency that shares an edge or a part of an edge among the sub-pixels, which are not intended to be limitative in embodiments of this disclosure.

In this embodiment, four pixels can be formed from six sub-pixels by sharing the sub-pixels; in contrast, existing technologies need twelve sub-pixels to form four pixels. Therefore, a display with a large number of pixels may be achieved by using a relatively small number of sub-pixels, and the display resolution is improved.

In an embodiment of the present disclosure, for example, a center line of the third sub-pixel 13 in the second pixel row of a pixel group may extend in a column direction and may coincide with a boundary line between the first sub-pixel 11 and the second sub-pixel 12 that are in the first pixel row of the pixel group. In other words, the third sub-pixel 13 in the second pixel row corresponds to half of the first sub-pixel 11 in the first pixel row and half of the second sub-pixel 12 in the first pixel row. Since the sub-pixels in each pixel row are sequentially arranged, the remaining sub-pixels in the second pixel row of the pixel group and the remaining sub-pixels in the first pixel row of the pixel group are correspondingly configured according to the above manner. For example, the center line of the first sub-pixel 11 in the second pixel row of the pixel group may extend in the column direction and coincide with a boundary line between the second sub-pixel 12 and the third sub-pixel 13 that are in the first pixel row of the pixel group.

In an embodiment of the present disclosure, each of the pixel groups is repeatedly arranged in the row direction and in the column direction. The same sub-pixels are not adjacent to each other. For two adjacent pixel groups aligned in the column direction, center lines of corresponding sub-pixels in the two adjacent pixel groups may extend in the column direction and coincide with each other. For example, for the first pixel group 1 and a pixel group (not shown) located below the first pixel group 1, center lines of the corresponding first sub-pixels 11 in the two adjacent pixel groups may be parallel with the column direction and may coincide with each other. Similarly, center lines of the corresponding second sub-pixels 12 in the two adjacent pixel groups may be parallel with the column direction and may coincide with each other, and center lines of the corresponding third sub-pixels 13 in the two adjacent pixel groups may be parallel with the column direction and may coincide with each other.

In an embodiment of the present disclosure, each of the first sub-pixels 11, the second sub-pixels 12, and the third sub-pixels 13 has a rectangular shape, and a ratio between a width and a length for each of the first sub-pixels 11, the second sub-pixels 12, and the third sub-pixels 13 is 2:3.

In an embodiment of the present disclosure, the first pixel row is a previous pixel row prior to the second pixel row, according to a top-to-bottom order in the pixel group as shown in the figure. That is, the first pixel row is a row of pixels or sub-pixels arranged in the first row of the pixel group, and the second pixel row is a row of pixels or sub-pixels arranged in the second row of the pixel group. In practical applications, for example the first pixel row may be a pixel row after the second pixel row, according to a top-to-bottom order in the pixel group as shown in the figure. That is, the second pixel row is a row of pixels or sub-pixels arranged in the first row of the pixel group, and the first pixel row is a row of pixels or sub-pixels arranged in the second row of the pixel group. This case is not shown in the figure.

Figure 2A:
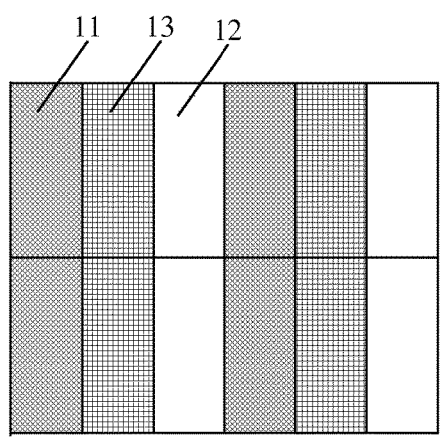
FIG. 2a is a schematic diagram of an arrangement of pixels in the display substrate.
Figure 2B:
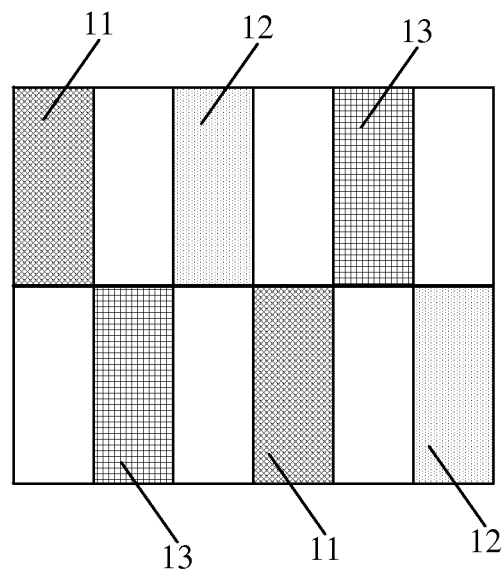

FIG. 2a and FIG. 2b show the principles for forming a display substrate, where FIG. 2a is a schematic diagram that illustrates an arrangement of pixels in the display substrate and FIG. 2b is a schematic diagram that illustrates a variation of the arrangement of the pixels shown in FIG. 2a. FIG. 2a shows the arrangement of the pixels in the display substrate. For example, FIG. 2a shows four pixels arranged in a first row and a second row of the display substrate, and other pixels in the display substrate are repeatedly arranged in the same arrangement manner. That is, each pixel includes a first sub-pixel 11, a third sub-pixel 13, and a second sub-pixel 12 that are sequentially arranged in order. If the sub-pixels in the odd-numbered rows and the even-numbered columns and the sub-pixels in the even-numbered rows and the odd-numbered columns are removed from FIG. 2a, an arrangement manner for the pixels is formed as illustrated in FIG. 2b. If the width of each sub-pixel in FIG. 2b is also expanded to cause the sub-pixels to be closely arranged, the pixel arrangement manner shown in FIG. 1 is formed.

In an embodiment of the present disclosure, the first sub-pixel 11 is a sub-pixel R of a red color, the second sub-pixel 12 is a sub-pixel B of a blue color, and the third sub-pixel 13 is a sub-pixel G of a green color. The sub-pixels in the display substrate are sequentially arranged in the order of RBG. In practical applications, the sub-pixels in the display substrate may be also arranged successively according to other orders, which are not listed herein. Similarly, a similar arrangement may be also configured for a display substrate with sub-pixels of four or more colors.

Figure 3A:
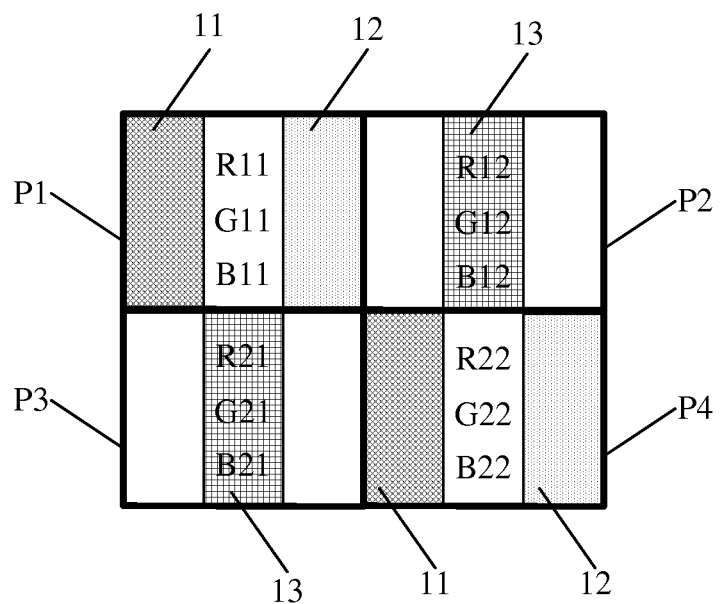
FIG. 3a is a schematic diagram that illustrates a respective input value for each pixel in FIG. 2b.

FIG. 3a is a schematic diagram that illustrates a respective input value for each pixel in FIG. 2b (only input values for part of the pixels are shown). As shown in FIG. 3a, four pixels, i.e., a first pixel P1, a second pixel P2, a third pixel P3, and a fourth pixel P4 are illustrated. In order to display all colors in a color gamut, three primary colors, i.e., red color, green color, and blue color, are usually used to display images. That is, each pixel includes a first sub-pixel 11, a second sub-pixel 12, and a third sub-pixels 13. Thus, an input value of each pixel includes an input value Rij for the first sub-pixel, an input value Bij for the second sub-pixel, and an input value Gij for the third sub-pixel, where i represents a row number of the pixel, and j represents a column number of the pixel. For example, input values of the first pixel P1 located in the first row and the first column include an input value R11 of the first sub-pixel, an input value B11 of the second sub-pixel, and an input value G11 of the third sub-pixel. Input values of the second pixel P2 located in the first row and the second column include an input value R12 of the first sub-pixel, an input value B12 of the second sub-pixel, and an input value G12 of the third sub-pixel. Input values of the third pixel P3 located in the second row and the first column include an input value R21 of the first sub-pixel, an input value B21 of the second sub-pixel, and an input value G21 of the third sub-pixel. Input values of the fourth pixel P4 located in the second row and the second column include an input value R22 of the first sub-pixel, an input value B22 of the second sub-pixel, and an input value G22 of the third sub-pixel. Since part of sub-pixels of each pixel shown in FIG. 3a are removed, each pixel may need to share part of the sub-pixels from an adjacent pixel in order to display all colors in an entire color gamut. That is, each pixel may need to borrow sub-pixels related to colors missed in that pixel from one or more adjacent pixels, so that input values of each pixel include input values of three sub-pixels.

Figure 3B:
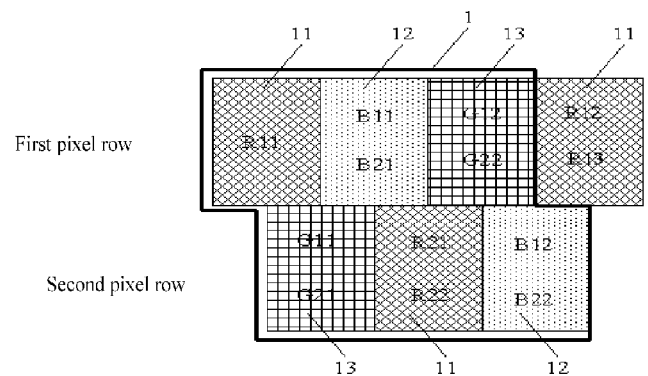
FIG. 3b is a schematic diagram that illustrates a respective input value for each pixel in FIG. 1.

To summarize what is described above, input values of each pixel in the display substrate are shown in FIG. 3b according to embodiments of the disclosure. FIG. 3b is a schematic diagram that illustrates input values of each pixel in FIG. 1. Based on the input values illustrated in FIG. 3a, input values of the sub-pixels shown in FIG. 1 may be labeled to form FIG. 3b. As shown in FIG. 3b, a pixel group 1 at a start edge or a start margin includes a first pixel P1, a second pixel P2, a third pixel P3, and a fourth pixel P4. The first pixel P1 includes a first sub-pixel 11 in the first pixel row, a second sub-pixel 12 in the first pixel row, and a third sub-pixel 13 in the second pixel row. Thus, an input value of the first sub-pixel 11 in the first pixel row is R11, an input value of the second sub-pixel 12 in the first pixel row is B11, and an input value of the third sub-pixel 13 in the second pixel row is G11. The second pixel P2 includes a third sub-pixel 13 in the first pixel row, a second sub-pixel 12 in the second pixel row, and a first sub-pixel 11 in the first pixel row of an adjacent pixel group in the row direction. Thus, an input value of the third sub-pixel 13 in the first pixel row is G12, an input value of the second sub-pixel 12 in the second pixel row is B12, and an input value of the first sub-pixel 11 in the first pixel row of the adjacent pixel group in the row direction is R12. The third pixel P3 includes the second sub-pixel 12 in the first pixel row, the third sub-pixel 13 in the second pixel row, and a first sub-pixel 11 in the second pixel row. Thus, another input value of the second sub-pixel 12 in the first pixel row is B21, another input value of the third sub-pixel 13 in the second pixel row is G21, and an input value of the first sub-pixel 11 in the second pixel row is R21. The fourth pixel P4 includes the third sub-pixel 13 in the first pixel row, the first sub-pixel 11 in the second pixel row, and the second sub-pixel 12 in the second pixel row. Thus, another input value of the third sub-pixel 13 in the first pixel row is G22, another input value of the first sub-pixel 11 in the second pixel row is R22, and another input value of the second sub-pixel 12 in the second pixel row is B22. In summary, in the pixel group 1, the input value of the first sub-pixel 11 in the first pixel row includes R11; the input values of the second sub-pixel 12 in the first pixel row include B11 and B21; the input values of the third sub-pixel 13 in the first pixel row include G12 and G22; the input values of the first sub-pixel 11 in the second pixel row include R21 and R22; the input values of the second sub-pixel 12 in the second pixel row include B12 and B22; and the input values of the third sub-pixel 13 in the second pixel row include G11 and G21. If another input value of the first sub-pixel 11 in the first pixel row of the adjacent pixel group that is next to the pixel group 1 in the row direction includes R13, the input values of the first sub-pixel 11 in the first pixel row of the adjacent pixel group include R12 and R13.

A method of calculating a respective output value for each sub-pixel in the display substrate provided in embodiments of the disclosure will be described below in more detail though a specific example.

Figure 4A:
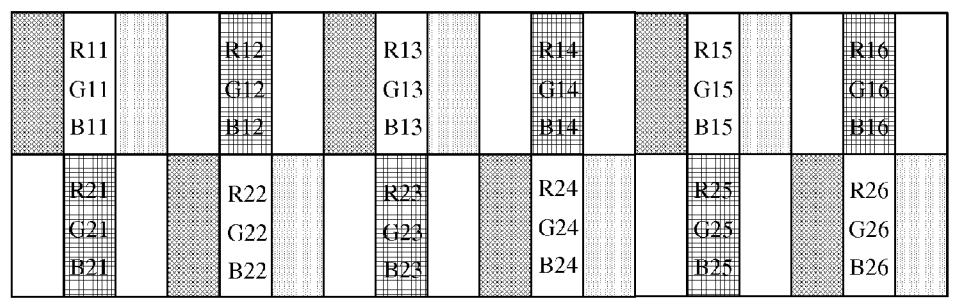
FIG. 4a is a schematic diagram that illustrates calculation of input values of the pixels in the first embodiment.
Figure 4B:
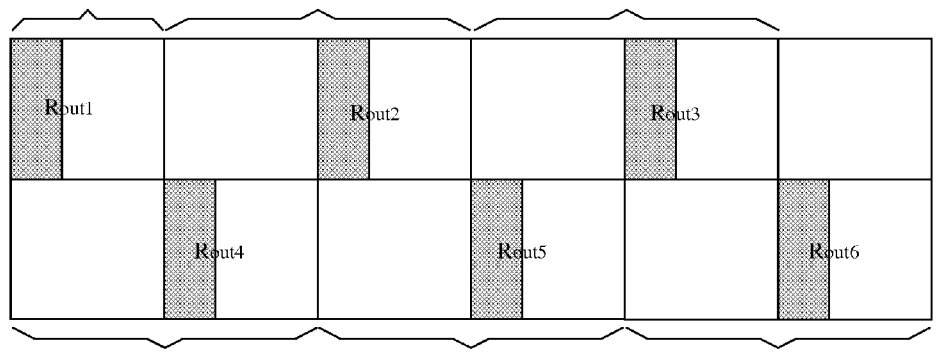

FIG. 4a is a schematic diagram that illustrates a respective input value of each pixel in the first embodiment, and FIG. 4b is a schematic diagram that illustrates calculation of output values for the first sub-pixel based on input values of the pixels shown in FIG. 4a. With reference to FIG. 3b, FIG. 4a, and FIG. 4b, if a pixel group is located at a start edge or a start margin, an output value of the first sub-pixel 11 in the first pixel row of the pixel group is equal to the input value of the first sub-pixel 11 of the first pixel in the pixel group. Take FIG. 3b as an example, $R_{out1}=R11$, where $R_{out1}$ represents the output value of the first sub-pixel 11 in the first pixel row of the pixel group 1 and R11 represents the input value of the first sub-pixel 11 from the first pixel of the pixel group 1. If the pixel group is not located at the start edge, an output value of the first sub-pixel 11 in the first pixel row of the pixel group is equal to an average of the input value of the first sub-pixel 11 from the first pixel of the pixel group and the input value of the first sub-pixel 11 from the second pixel of a previous pixel group that is in the same pixel rows as the pixel group. Take FIG. 3b as an example, $R_{out2}=(R12+R13)/2$, where $R_{out2}$ represents an output value of the first sub-pixel 11 in the first pixel row of the pixel group, R13 represents the input value of the first sub-pixel 11 from the first pixel of the pixel group, and R12 represents the input value of the first sub-pixel 11 from the second pixel of the previous pixel group 1 that is in the same pixel rows as the pixel group. Similarly, an output value of the first sub-pixel 11 in the first pixel row of a next pixel group is $R_{out3}=(R14+R15)/2$, where R15 represents an input value of the first sub-pixel 11 from the first pixel of the next pixel group, and R14 represents the input value of the first sub-pixel 11 from the second pixel of the pixel group that is prior to the next pixel group and in the same pixel rows as the next pixel group. Output values of the remaining first sub-pixels 11 in the first pixel row in the respective remaining pixel groups may be calculated similarly, which is not repeated here. An output value of the first sub-pixel 11 in the second pixel row of a pixel group is equal to an average of the input value of the first sub-pixel 11 in the third pixel of the pixel group and the input value of the first sub-pixel 11 in the fourth pixel of the pixel group. Take FIG. 3b as an example, $R_{out4}=(R21+R22)/2$, where $R_{out4}$ represents the output value of the first sub-pixel 11 in the second pixel row of the pixel group, R21 represents the input value of the first sub-pixel 11 in the third pixel of the pixel group, and R22 represents the input value of the first sub-pixel 11 in the fourth pixel of the pixel group. Similarly, output values of the first sub-pixel 11 in the second pixel row of next two pixel groups are $R_{out5}=(R23+R24)/2$, $R_{out6}=(R25+R26)/2$, and so on and so forth. Output values of the remaining first sub-pixels 11 in the second pixel row in the respective remaining pixel groups may be calculated similarly, which is not repeated here.

Figure 4C:
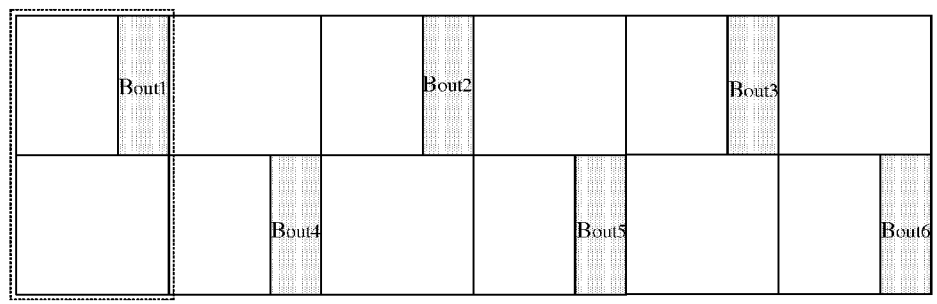

FIG. 4c is a schematic diagram that illustrates calculation of output values of the second sub-pixel according to the input values of the pixels shown in FIG. 4a. With reference to FIG. 3b, FIG. 4a, and FIG. 4c, an output value of the second sub-pixel 12 in the first pixel row of the pixel group is an average of the input value of the second sub-pixel 12 from the first pixel of the pixel group and the input value of the second sub-pixel 12 from the third pixel of the pixel group. Take FIG. 3b as an example, $B_{out1}=(B11+B21)/2$, where $B_{out1}$ represents an output value of the second sub-pixel 12 in the first pixel row of the pixel group, B11 represents the input value of the second sub-pixel 12 from the first pixel of the pixel group, and B21 represents the input value of the second sub-pixel 12 from the third pixel of the pixel group. Similarly, an output value of the second sub-pixel 12 in the first pixel row of a next pixel group is $B_{out2}=(B13+B23)/2$, an output value of the second sub-pixel 12 in the first pixel row of a pixel group that is next to the next pixel group is $B_{out3}=(B15+B25)/2$, and so on and so forth. Output values of the remaining second sub-pixels 12 in the first pixel row in the respective remaining pixel groups may be calculated similarly, which is not repeated here. An output value of the second sub-pixel 12 in the second pixel row of the pixel group is equal to an average of the input value of the second sub-pixel 12 from the second pixel of the pixel group and the input value of the second sub-pixel 12 from the fourth pixel of the pixel group. Take FIG. 3b as an example, $B_{out4}$=(B12+B22)/2, where $B_{out4}$ represents an output value of the second sub-pixel 12 in the second pixel row of the pixel group, B12 represents the input value of the second sub-pixel 12 from the second pixel of the pixel group, and B22 represents the input value of the second sub-pixel 12 from the fourth pixel of the pixel group. Similarly, an output value of the second sub-pixel 12 in the second pixel row of a next pixel group is $B_{out5}$=(B14+B24)/2, an output value of the second sub-pixel 12 in the second pixel row of a pixel group that is next to the next pixel group is $B_{out6}$=(B16+B26)/2, and so on and so forth. Output values of the remaining second sub-pixels 12 in the second pixel row may be calculated similarly, which is not repeated here.

Figure 4D:
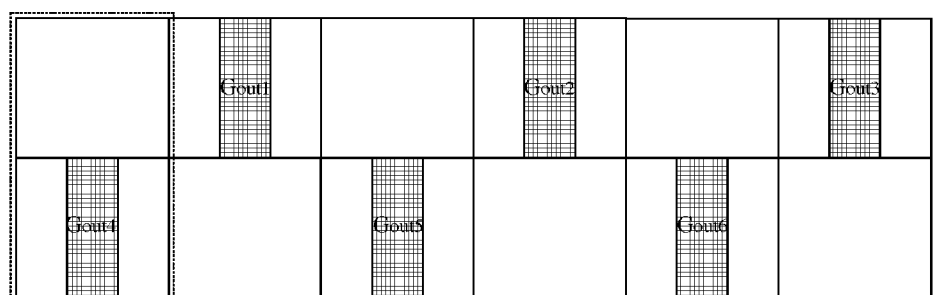

FIG. 4d is a schematic diagram that illustrates calculation of output values of the third sub-pixel according to the input values of the pixels shown in FIG. 4a. With reference to FIG. 3b, FIG. 4a, and FIG. 4d, an output value of the third sub-pixel 13 in the first pixel row of the pixel group is equal to an half of a sum of the input value of the third sub-pixel 13 from the second pixel of the pixel group and the input value of the third sub-pixel 13 from the fourth pixel of the pixel group. Take FIG. 3b as an example, $G_{out1}$=(G12+G22)/2, where $G_{out1}$ represents the output value of the third sub-pixel 13 in the first pixel row of the pixel group, G12 represents the input value of the third sub-pixel 13 from the second pixel of the pixel group, and G22 represents the input value of the third sub-pixel 13 from the fourth pixel of the pixel group. Similarly, an output value of the third sub-pixel 13 in the first pixel row of a next pixel group is $G_{out2}$=(G14+G24)/2, an output value of the third sub-pixel 13 in the pixel first row of a pixel group that is next to the next pixel group is $G_{out3}$=(G16+G26)/2, and so on and so forth. Output values of the remaining third sub-pixels 13 in the first pixel row may be calculated similarly, which is not repeated here. An output value of the third sub-pixel 13 in the second pixel row of the pixel group is equal to an half of the sum of the input value of the third sub-pixel 13 from the first pixel of the pixel group and the input value of the third sub-pixel 13 from the third pixel of the pixel group. Take FIG. 3b as an example, $G_{out4}$=(G11+G21)/2, where $G_{out4}$ represents the output value of the third sub-pixel 13 in the second pixel row of the pixel group, G11 represents the input value of the third sub-pixel 13 from the first pixel, and G21 represents the input value of the third sub-pixel 13 from the third pixel. Similarly, an output value of the third sub-pixel 13 in the second pixel row of a next pixel group is $G_{out5}$=(G13+G23)/2, an output value of the third sub-pixel 13 in the second pixel row of a pixel group that is next to the next pixel group is $G_{out6}$=(G15+G25)/2, and so on and so forth. Output values of the remaining third sub-pixels 13 in the second pixel row may be calculated similarly, which is not repeated here.

Figure 5:
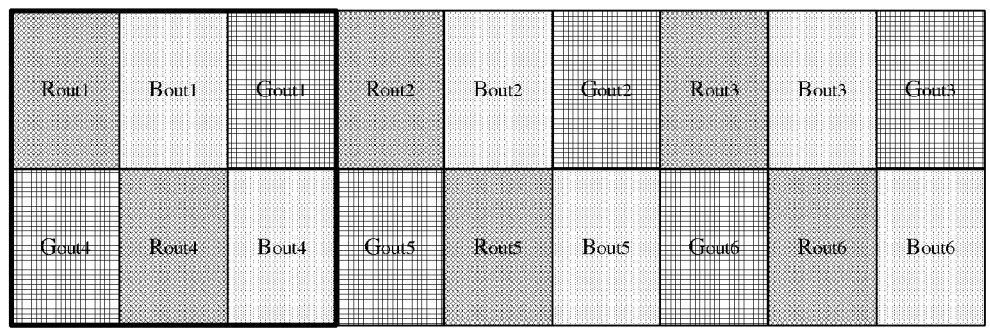
FIG. 5 is a schematic diagram that illustrates a distribution of the output values of the sub-pixels in the first embodiment.

FIG. 5 is a schematic diagram that illustrates a distribution of the output values of the sub-pixels in the first embodiment (only output values of part of the sub-pixels are shown in FIG. 5). As shown in FIG. 5, multiple output signal pixel groups are also formed on a display screen of the display device. For example, a first output signal pixel group includes the output value $R_{out1}$ of the first sub-pixel located at the first pixel row, the output value $B_{out1}$ of the second sub-pixel located at the first pixel row, the output value $G_{out1}$ of the third sub-pixel located at the first pixel row, the output value $G_{out4}$ of the third sub-pixel located at the second pixel row, the output value $R_{out4}$ of the first sub-pixel located at the second pixel row, and the output value $B_{out4}$ of the second sub-pixel located at the second pixel row. Output values of the remaining sub-pixels are arranged in accordance with the arrangement of the sub-pixels in the first output signal pixel group as shown in FIG. 5, and the description is not repeated here. It is understood that depiction of the output values of the respective sub-pixels in the figure is only for illustration purposes and is not intended to limit the shapes and positions of the sub-pixels.

In a technical solution of the display substrate provided in at least one embodiment of the present disclosure, each pixel group includes six sub-pixels. By sharing sub-pixels, the six sub-pixels may form four pixels, thereby enabling the display device to achieve a higher display resolution with a low physical resolution. By sharing the sub-pixels, four pixels may be displayed with only six sub-pixels in at least one embodiment of the disclosure, so that a quantity of sub-pixels in the display substrate is reduced. As a result, a quantity of data lines is reduced, thereby reducing a power consumption of the display device and increasing an opening rate of the display device. By sharing the sub-pixels, four pixels may be displayed with only six sub-pixels in at least one embodiment of the disclosure, so that the number of sub-pixels in the display substrate is reduced. As a result, a size of each sub-pixel may be increased, thereby decreasing manufacture difficulty in a manufacturing process of the display device and reducing a cost of the display device. In at least one embodiment of the present disclosure, if the size of each sub-pixel is set to be a smaller size, the display device may achieve a higher physical resolution and improve the display resolution thereof. In at least one embodiment of the present disclosure, by setting the sub-pixels in a new arrangement manner and by calculating a respective output value for each sub-pixel with a respective virtual algorithm, the output value of each sub-pixel may be made to be more close to the input value of the respective sub-pixel, thereby improving the display quality of the display screen.

Figure 6:
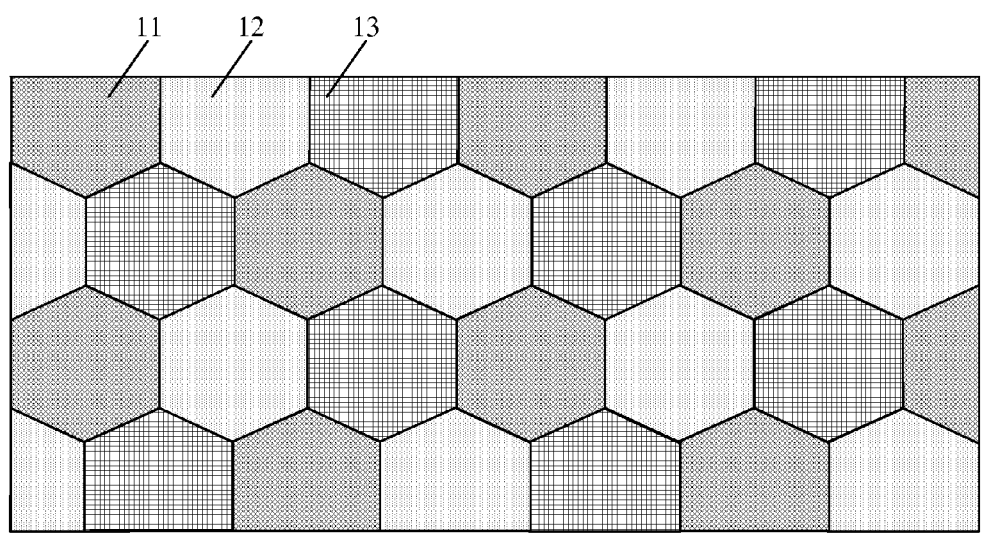
FIG. 6 is a schematic diagram of a configuration of a display substrate according to a second embodiment of the present disclosure.

FIG. 6 is a schematic diagram of a configuration of a display substrate according to a second embodiment of the present disclosure. As shown in FIG. 6, the display substrate provided in this embodiment is different from the display substrate provided in the above first embodiment in that the shapes of the first sub-pixels 11, the second sub-pixels 12, and the third sub-pixels 13 are hexagons, for example, regular hexagons.

In practical applications, the shapes of the first sub-pixels 11, the second sub-pixels 12, and the third sub-pixel 13 may also be other shapes which are symmetrical relative to their respective center lines that extend in the column direction.

Other description for the display substrate provided in the second embodiment may refer to that of the first embodiment described above, which is not repeated here.

In a technical solution of the display substrate provided in at least one embodiment of the present disclosure, each pixel group includes six sub-pixels. By sharing sub-pixels, the six sub-pixels may form four pixels, thereby enabling the display device to achieve a higher display resolution with a low physical resolution. By sharing the sub-pixels, four pixels may be displayed with only six sub-pixels in at least one embodiment of the disclosure, so that a quantity of sub-pixels in the display substrate is reduced. As a result, a quantity of data lines is reduced, thereby reducing a power consumption of the display device and increasing an opening rate of the display device. By sharing the sub-pixels, four pixels may be displayed with only six sub-pixels in at least one embodiment of the disclosure, so that the number of sub-pixels in the display substrate is reduced. As a result, a size of each sub-pixel may be increased, thereby alleviating manufacture difficulty in a manufacturing process of the display device and reducing a cost of the display device. In at least one embodiment of the present disclosure, if the size of each sub-pixel is set to be a smaller size, the display device may achieve a higher physical resolution and improve the display resolution thereof. In at least one embodiment of the present disclosure, by setting the sub-pixels in a new arrangement manner and by calculating a respective output value of each sub-pixel with a respective virtual algorithm, the output value of each sub-pixel may be made to be more close to the input value of the respective sub-pixel, thereby reducing a distortion of the output value of each sub-pixel greatly and improving the display quality of the display screen.

According to at least one embodiment of the present disclosure, a display device is provided. The display device includes: a display substrate provided according to the first embodiment or the second embodiment of the disclosure described above. Description for the display substrate may be provided with reference to that of the first embodiment or the second embodiment, which is not repeated here.

For example, the display device may include a liquid crystal display device, and the display substrate may be an array substrate. The display device may further include a color film substrate arranged opposite to the array substrate. A liquid crystal layer may be filled between the array substrate and the color film substrate.

For example, the display device may include an organic light emitting display device and the display substrate may be an organic light-emitting diode (OLED) display substrate.

In a technical solution of the display substrate provided in at least one embodiment of the present disclosure, each pixel group includes six sub-pixels. By sharing sub-pixels, the six sub-pixels may form four pixels, thereby enabling the display device to achieve a higher display resolution with a low physical resolution. By sharing the sub-pixels, four pixels may be displayed with only six sub-pixels in at least one embodiment, so that the number of sub-pixels in the display substrate is reduced. As a result, a quantity of data lines is reduced, thereby reducing a power consumption of the display device and increasing an opening rate of the display device. By sharing the sub-pixels, four pixels may be displayed with only six sub-pixels in at least one embodiment, so that the number of sub-pixels in the display substrate is reduced. As a result, a size of each sub-pixel may be larger, thereby reducing manufacture difficulty in a manufacturing process of the display device and a cost of the display device. In at least one embodiment of the present disclosure, if the size of each sub-pixel is set to be a smaller size, the display device may achieve a higher physical resolution and improve the display resolution thereof. In at least one embodiment of the present disclosure, by setting the sub-pixels in a new arrangement manner and by calculating a respective output value of each sub-pixel with a respective virtual algorithm, the output value of each sub-pixel may be made to be more close to the input value of the respective sub-pixel, thereby improving the display quality of the display screen.

Figure 7:
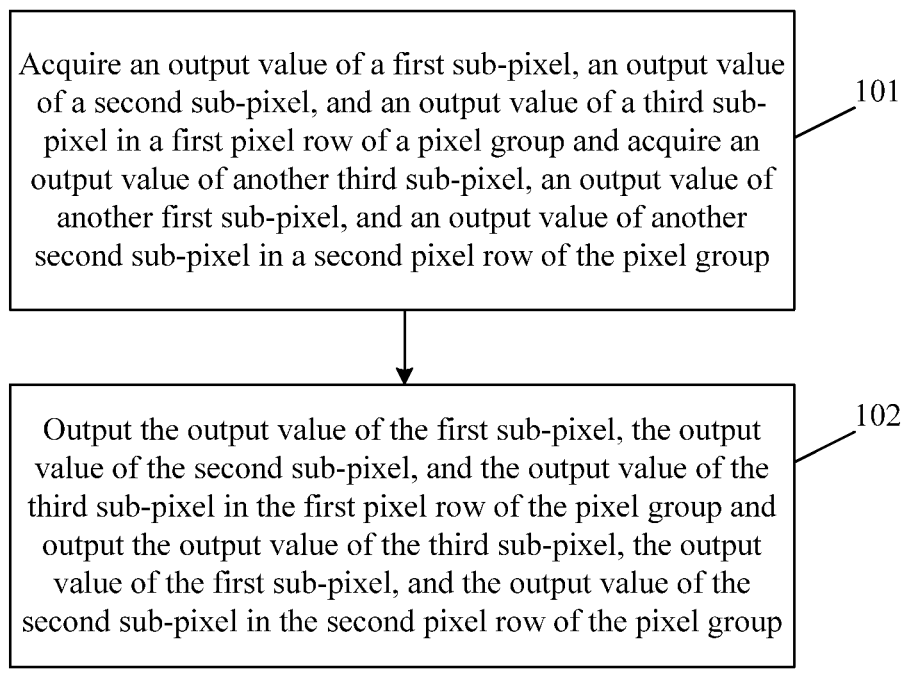
FIG. 7 is a flow chart of a driving method for driving a display substrate according to a fourth embodiment of the present disclosure.

In at least one embodiment of the present disclosure, a method for driving a display substrate is provided herein. The method may be used to drive the display substrate provided in the first embodiment or the second embodiment described above. FIG. 7 is a flow chart of a driving method for a display substrate according to an embodiment of the present disclosure. As shown in FIG. 7, the method includes:

Step 101 that includes: acquiring an output value of a first sub-pixel, an output value of a second sub-pixel, and an output value of a third sub-pixel in a first pixel row of a pixel group; and acquiring an output value of another third sub-pixel, an output value of another first sub-pixel, and an output value of another second sub-pixel in a second pixel row of the pixel group.

If the pixel group is located at a start edge (or a start margin), in Step 101 the acquiring the output value of the first sub-pixel, the output value of the second sub-pixel, and the output value of the third sub-pixel in the first pixel row of the pixel group includes, for example, the following steps:

Step 1011 that includes setting an input value of the first sub-pixel of the first pixel in the pixel group to be the output value of the first sub-pixel in the first pixel row;

Step 1012 that includes generating the output value of the second sub-pixel in the first pixel row by dividing a sum of an input value of the second sub-pixel from the first pixel of the pixel group and an input value of the second sub-pixel from the third pixel of the pixel group by two; and Step 1013 that includes generating an output value of the third sub-pixel in the first pixel row by dividing a sum of an input value of the third sub-pixel from the second pixel of the pixel group and an input value of the third sub-pixel from the fourth pixel of the pixel group by two.

The steps 1011, 1012, and 1013 may be performed in any order or may be carried out simultaneously, and no limitation is set herein. In some examples, the first sub-pixel may be a red sub-pixel, the second sub-pixel may be a blue sub-pixel, and the third sub-pixel may be a green sub-pixel. Alternatively, the first sub-pixel, the second sub-pixel, and the third sub-pixel may be assigned with any other colors or with colors in any order, and no restriction is set herein.

If the pixel group is not located at a start edge, in Step 101 the acquiring the output value of the first sub-pixel, the output value of the second sub-pixel, and the output value of the third sub-pixel in the first pixel row of the pixel group includes, for example, the following steps:

Step 1021 that includes generating the output value of the first sub-pixel in the first row pixel by dividing a sum of the input value of the first sub-pixel from the first pixel of the pixel group and an input value of the first sub-pixel from the second pixel of a previous pixel group by two, the previous pixel group located, for example, immediately prior to the pixel group and in the same pixel rows as the pixel group;

Step 1022 that includes generating the output value of the second sub-pixel in the first pixel row by dividing the sum of the input value of the second sub-pixel from the first pixel of the pixel group and the input value of the second sub-pixel from the third pixel of the pixel group by two;

Step 1023 that includes generating the output value of the third sub-pixel in the first pixel row by dividing the sum of the input value of the third sub-pixel from the second pixel of the pixel group and the input value of the third sub-pixel from the fourth pixel of the pixel group by two.

The steps 1021, 1022, and 1023 may be performed in any order or may be carried out simultaneously, and no restriction is set herein. In some examples, the first sub-pixel may be a red sub-pixel, the second sub-pixel may be a blue sub-pixel, and the third sub-pixel may be a green sub-pixel. Alternatively, the first sub-pixel, the second sub-pixel, and the third sub-pixel may be sub-pixels of any other colors or of colors in any order, and no restriction is placed herein.

In Step 101, the acquiring the output value of the third sub-pixel, the output value of the first sub-pixel, and the output value of the second sub-pixel in the second pixel row of the pixel group includes, for example, the following steps:

Step 1031 that includes generating the output value of the third sub-pixel in the second pixel row by dividing a sum of the input value of the third sub-pixel of the first pixel in the pixel group and the input value of the third sub-pixel of the third pixel in the pixel group by two;

Step 1032 that includes generating the output value of the first sub-pixel in the second pixel row by dividing a sum of the input value of the first sub-pixel of the third pixel in the pixel group and the input value of the first sub-pixel of the fourth pixel in the pixel group by two; and Step 1033 that includes generating the output value of the second sub-pixel in the second pixel row by dividing a sum of the input value of the second sub-pixel of the second pixel in the pixel group and the input value of the second sub-pixel of the fourth pixel in the pixel group by two.

The steps 1031, 1032, and 1033 may be performed in any order or may be carried out simultaneously, and no restriction is placed herein. In some examples, the first sub-pixel may be a red sub-pixel, the second sub-pixel may be a blue sub-pixel, and the third sub-pixel may be a green sub-pixel. Alternatively, the first sub-pixel, the second sub-pixel, and the third sub-pixel may be sub-pixels of any other colors or of colors in any order, and no restriction is set herein.

The method further includes Step 102 that includes: outputting the output value of the first sub-pixel, the output value of the second sub-pixel, and the output value of the third sub-pixel in the first pixel row of the pixel group; and outputting the output value of the third sub-pixel, the output value of the first sub-pixel, and the output value of the second sub-pixel in the second pixel row of the pixel group.

In the embodiment, calculation processes to obtain the output value of each first sub-pixel, the output value of each second sub-pixel, and the output value of each third sub-pixel are the same as those described above in the first embodiment. Detailed description for the calculation processes may be obtained with reference to the first embodiment and is not be repeated here.

In a technical solution of a manufacturing method of the display substrate provided in at least one embodiment of the present disclosure, each pixel group includes six sub-pixels. By sharing sub-pixels, the six sub-pixels may form four pixels, thereby enabling the display device to achieve a higher display resolution with a low physical resolution. By sharing the sub-pixels, four pixels may be displayed with only six sub-pixels in at least one embodiment, so that the number of sub-pixels in the display substrate is reduced. As a result, a quantity of data lines is reduced, thereby reducing a power consumption of the display device and increasing an opening rate of the display device. By sharing the sub-pixels, four pixels may be displayed with only six sub-pixels in at least one embodiment, so that the number of sub-pixels in the display substrate is reduced. As a result, a size of each sub-pixel may be larger, thereby reducing manufacture difficulty in a manufacturing process of the display device and a cost of the display device. In at least one embodiment of the present disclosure, if the size of each sub-pixel is set to be a smaller size, the display device may achieve a higher physical resolution and improve the display resolution thereof. In at least one embodiment of the present disclosure, by setting the sub-pixels in a new arrangement manner and by calculating a respective output value of each sub-pixel with a respective virtual algorithm, the output value of each sub-pixel may be made to be more close to the input value of the respective sub-pixel, thereby improving the display quality of the display screen.

What are described above is related to the illustrative embodiments of the present disclosure only and not limitative to the scope of the disclosure and the scopes of the disclosure are defined by the accompanying claims.

This application claims a priority of Chinese patent application No. 201410369714.X filed on Jul. 30, 2014, which is incorporated herein by reference in its entirety as a part of this application.

The invention claimed is:

1. A display substrate comprising:
pixel groups that are repeatedly arranged,
wherein each of the pixel groups includes two first sub-pixels, two second sub-pixels, and two third sub-pixels;
wherein in each of the pixel groups:
a first sub-pixel, a second sub-pixel, and a third sub-pixel are sequentially arranged in a first pixel row;
another third sub-pixel, another first sub-pixel, and another second sub-pixel are sequentially arranged in a second pixel row; and
a center line of any sub-pixel from the first pixel row and a center line of any sub-pixel from the second pixel row extend in the column direction and do not coincide with each other; and
wherein in a pixel group from the pixel groups:
a first sub-pixel and a second sub-pixel that are in a first pixel row of the pixel group are adjacent to a third sub-pixel in a second pixel row of the pixel group to form a first pixel;
a third sub-pixel in the first pixel row of the pixel group and a second sub-pixel in the second pixel row of the pixel group are adjacent to a first sub-pixel in a first pixel row of an adjacent pixel group to form a second pixel;
the second sub-pixel in the first pixel row of the pixel group is adjacent to the third sub-pixel and a first sub-pixel that are in the second pixel row of the pixel group to form a third pixel; and
the third sub-pixel in the first pixel row of the pixel group is adjacent to the first sub-pixel and the second sub-pixel that are in the second pixel row of the pixel group to form a fourth pixel.

2. The display substrate of claim 1, wherein:
a center line of the third sub-pixel in the second pixel row of the pixel group extends in a column direction; and
the center line of the third sub-pixel in the second pixel row of the pixel group coincides with a boundary line between the first sub-pixel and the second sub-pixel that are in the first pixel row of the pixel group.

3. The display substrate of claim 1, wherein:
the pixel groups are repeatedly arranged in a row direction and in a column direction;
identical sub-pixels are not adjacent with each other; and
for two adjacent pixel groups in the column direction, center lines of corresponding sub-pixels in the two adjacent pixel groups extend in the column direction and coincide with each other.

4. The display substrate of claim 1, wherein:
each of the first sub-pixels, the second sub-pixels, and the third sub-pixels has a rectangular shape; and
each of the first sub-pixels, the second sub-pixels, and the third sub-pixels has a width-length ratio of 2:3.

5. The display substrate of claim 1, wherein each of the first sub-pixels, the second sub-pixels, and the third sub-pixels has a hexagonal shape.

6. The display substrate of claim 1, wherein according to a top-to-bottom order in the pixel group,
the first pixel row is a pixel row prior to the second pixel row.

7. A display device comprising the display substrate of claim 1.

8. A driving method for driving the display substrate of claim 1, the driving method comprising:
acquiring an output value of the first sub-pixel, an output value of the second sub-pixel, and an output value of the third sub-pixel in the first pixel row of the pixel group;
acquiring an output value of the third sub-pixel, an output value of the first sub-pixel, and an output value of the second sub-pixel in the second pixel row of the pixel group;
outputting the output value of the first sub-pixel, the output value of the second sub-pixel, and the output value of the third sub-pixel in the first pixel row of the pixel group; and
outputting the output value of the third sub-pixel, the output value of the first sub-pixel, and the output value of the second sub-pixel in the second pixel row of the pixel group.

9. The driving method of claim 8, wherein, if the pixel group is located at a start edge, the acquiring the output value of the first sub-pixel, the output value of the second sub-pixel, and the output value of the third sub-pixel in the first pixel row of the pixel group includes:
setting an input value of the first sub-pixel from the first pixel of the pixel group as the output value of the first sub-pixel in the first pixel row;
generating the output value of the second sub-pixel in the first pixel row by dividing a sum of an input value of the second sub-pixel from the first pixel of the pixel group and an input value of the second sub-pixel from the third pixel of the pixel group by two; and
generating the output value of the third sub-pixel in the first pixel row by dividing a sum of an input value of the third sub-pixel from the second pixel of the pixel group and an input value of the third sub-pixel from the fourth pixel of the pixel group by two.

10. The driving method of claim 8, wherein, if the pixel group is not located at a start edge, the acquiring the output value of the first sub-pixel, the output value of the second sub-pixel, and the output value of the third sub-pixel in the first pixel row of the pixel group includes:
generating the output value of the first sub-pixel in the first pixel row by dividing a sum of an input value of the first sub-pixel from the first pixel of the pixel group and an input value of a first sub-pixel from a second pixel of a previous pixel group by two, wherein the previous pixel group is prior to the pixel group and in the same pixel rows as the pixel group;
generating the output value of the second sub-pixel in the first pixel row by dividing a sum of an input value of the second sub-pixel from the first pixel of the pixel group and an input value of the second sub-pixel from the third pixel of the pixel group by two; and
generating the output value of the third sub-pixel in the first pixel row by dividing a sum of an input value of the third sub-pixel in the second pixel of the pixel group and an input value of the third sub-pixel from the fourth pixel of the pixel group by two.

11. The driving method of claim 8, wherein the acquiring the output value of the third sub-pixel, the output value of the first sub-pixel, and the output value of the second sub-pixel in the second pixel row of the pixel group includes:
generating the output value of the third sub-pixel in the second pixel row by dividing a sum of an input value of the third sub-pixel from the first pixel of the pixel group and an input value of the third sub-pixel from the third pixel of the pixel group by two;
generating the output value of the first sub-pixel in the second pixel row by dividing a sum of an input value of the first sub-pixel from the third pixel of the pixel group and an input value of the first sub-pixel from the fourth pixel of the pixel group by two; and
generating the output value of the second sub-pixel in the second pixel row by dividing a sum of an input value of the second sub-pixel from the second pixel of the pixel group and an input value of the second sub-pixel from the fourth pixel of the pixel group by two.

12. The display substrate of claim 2, wherein:
the pixel groups are repeatedly arranged in a row direction and in a column direction;
identical sub-pixels are not adjacent with each other; and
for two adjacent pixel groups in the column direction, center lines of corresponding sub-pixels in the two adjacent pixel groups extend in the column direction and coincide with each other.

13. The display substrate of claim 1, wherein according to a top-to-bottom order in the pixel group, the first pixel row is a pixel row after the second pixel row.

14. The display substrate of claim 2, wherein:
each of the first sub-pixels, the second sub-pixels, and the third sub-pixels has a rectangular shape; and
each of the first sub-pixels, the second sub-pixels, and the third sub-pixels has a width-length ratio of 2:3.

15. The display substrate of claim 2, wherein each of the first sub-pixels, the second sub-pixels, and the third sub-pixels has a hexagonal shape.

16. The display substrate of claim 2, wherein according to a top-to-bottom order in the pixel group, the first pixel row is a pixel row prior to the second pixel row.

17. The display substrate of claim 2, wherein according to a top-to-bottom order in the pixel group, the first pixel row is a pixel row after the second pixel row.

18. The display substrate of claim 3, wherein each of the first sub-pixels, the second sub-pixels, and the third sub-pixels has a hexagonal shape.

19. The display substrate of claim 3, wherein according to a top-to-bottom order in the pixel group, the first pixel row is a pixel row prior to the second pixel row.

20. The display substrate of claim 3, wherein according to a top-to-bottom order in the pixel group, the first pixel row is a pixel row after the second pixel row.

* * * * *